(12) United States Patent
Diehl

(10) Patent No.: US 12,292,493 B2
(45) Date of Patent: May 6, 2025

(54) METHOD FOR HETERONUCLEAR QUANTITATIVE DETERMINATION BY NMR SPECTROSCOPY, REFERENCE SUBSTANCES THEREFOR AND METHOD FOR DETERMINING THE DEGREE OF DEUTERATION OF A DEUTERATED COMPOUND

(71) Applicant: Bruker Biospin GmbH, Rheinstetten (DE)

(72) Inventor: Bernd Willi Karl-Heinz Diehl, Cologne (DE)

(73) Assignee: Bruker Biospin GmbH, Rheinstetten (DE)

( * ) Notice: Subject to any disclaimer, the term of this patent is extended or adjusted under 35 U.S.C. 154(b) by 1154 days.

(21) Appl. No.: 16/979,137

(22) PCT Filed: Mar. 6, 2019

(86) PCT No.: PCT/EP2019/055520
§ 371 (c)(1),
(2) Date: Sep. 8, 2020

(87) PCT Pub. No.: WO2019/170717
PCT Pub. Date: Sep. 12, 2019

(65) Prior Publication Data
US 2020/0400766 A1 Dec. 24, 2020

(30) Foreign Application Priority Data

Mar. 7, 2018 (DE) .................... 10 2018 203 434.6

(51) Int. Cl.
*G01R 33/46* (2006.01)
*G01R 35/00* (2006.01)

(52) U.S. Cl.
CPC ....... *G01R 33/4625* (2013.01); *G01R 35/005* (2013.01)

(58) Field of Classification Search
CPC ... G01R 33/4625; G01R 35/005; G01R 33/46
(Continued)

(56) References Cited

U.S. PATENT DOCUMENTS 4,550,082 A * 10/1985 Martin ................. G01N 33/146
436/24
5,397,989 A 3/1995 Spraul et al.
(Continued)

FOREIGN PATENT DOCUMENTS

| CH | 407591 | 2/1966 |
|---|---|---|
| CN | 10756111 | 1/2018 |

(Continued)

OTHER PUBLICATIONS

Singleton, D. A. et al., Journal of the American Chemical Society 1995, 117, 9357-9358 with 4 pages of supporting information. (Year: 1995).*

(Continued)

*Primary Examiner* — Arlen Soderquist
(74) *Attorney, Agent, or Firm* — Lewis Kohn & Walker LLP; David M. Kohn; Kari Moyer-Henry (57) ABSTRACT

Disclosed are a method for the quantitative determination of an analyte in a test item using a NMR spectrometer, wherein the deuterated solvent used to dissolve the analyte is used as the internal standard, and specific reference substances for use in the method according to the invention. Further described is a method for determining the degree of deuteration of a deuterated compound.

2 Claims, 7 Drawing Sheets

(58) Field of Classification Search
USPC .......................................................... 436/173
See application file for complete search history.

(56) References Cited

U.S. PATENT DOCUMENTS

| 8,248,072 | B1 | 8/2012 | Colson et al. |
| 2008/0088308 | A1 | 4/2008 | Carpenter et al. |
| 2015/0077104 | A1 | 3/2015 | Diehl |
| 2020/0158668 | A1 | 5/2020 | Hausler |

FOREIGN PATENT DOCUMENTS

| DE | 10160177 | 6/2003 |
| DE | 102012204701 | 9/2013 |
| DE | 102012224334 | 7/2014 |
| JP | 2008048878 | 3/2008 |
| JP | 2011232079 | 11/2011 |
| JP | 2012058200 | 3/2012 |
| JP | 2012177643 | 9/2012 |
| WO | 2015090325 | 6/2015 |
| WO | 2016142620 | 9/2016 |
| WO | 20180015463 | 1/2018 |

OTHER PUBLICATIONS

Maurer, T et al., Journal of Magnetic Resonance, Series B 1996, 113, 177-178 (Year: 1996).*
Pierens, G, K. et al., Journal of Natural Products 2008, 71, 810-813 with 10 pages of supporting information. (Year: 2008).*
Mo, H. et al., Analytical Chemistry 2008, 80, 9835-9839 with 2 pages of supporting information. (Year: 2008).*
Jackowski, K. et al., Journal of Physical CHemistry A 2010, 114, 2471-2475. (Year: 2010).*
Rundlof, T. et al, Journal of Pharmaceutical and Biomedical Analysis 2010, 52, 645-651. (Year: 2010).*
Darwish, T. A. et al., Analytica Chimica Acta 2016, 927, 89-98. (Year: 2016).*
Rosenau, C. P. et al., Angewandte Chemie International Edition 2018, 57, 9528-9533. (Year: 2018).*
Buchli, R. et al., NMR in Biomedicine 1994, 7, 225-230. (Year: 1994).*
Bottomley, P. A. et al., Magnetic Resonance in Medicine 1996, 35, 664-670. (Year: 1996).*
Rao, V. M. et al., Journal of Pharmaceutical Sciences 1997, 86, 1132-1137. (Year: 1997).*
Cross, J. L. et al., The Chemical Educator 1998, 3, 9 pages. (Year: 1998).*
McAuley, B. et al., Journal of Labelled Compounds and Radiopharmaceuticals 2003, 46, 1191-1204. (Year: 2003).*
Hoffman, R. E., Magnetic Resonance in Chemistry 2006, 44, 606-616. (Year: 2006).*
Granger, P. et al., Concepts in Magnetic Resonance: Part A 2007, 30A 184-193. (Year: 2007).*
Satapati, S. et al., Diabetes 2008, 57, 2012-2021. (Year: 2008).*
Sekiyama, Y. et al, Analytical Chemistry 2010, 82, 1643-1652. (Year: 2010).*
Tissot van Patot, M. C. et al., American Journal of Physiology-Regulatory, Integrative and Comparative Physiology 2010, 298, R166-R172. (Year: 2010).*
Hamid, Z. A. A. et al., Biomaterials, 2010, 31, 6454-6467. (Year: 2010).*
Mo, H. et al., Magnetic Resonance in Chemistry 2010, 48, 782-786. (Year: 2010).*
Mo, H. et al., Magnetic Resonance in Chemistry 2011, 49, 655-658. (Year: 2011).*
Mazurowski, M. et al., Macromolecular Chemistry and Physics 2013, 214, 1094-1106. (Year: 2013).*
Weber, M. et al., Analytical and Bioanalytical Chemistry 2015, 407, 3115-3123. (Year: 2015).*
Young, D. C. et al., Analytical Chemistry 1984, 56, 557-562. (Year: 1984).*
Beyer, et al. "Quantitative NMR spectroscopy of biologically active substances and excipients." (2010) Bioanal. Rev. 2:1-22.
Bharti et al. "Quantitative 1H NMR spectroscopy." Trac Trends in Analytical Chemistry vol. 35, May 2012, pp. 5-26.
Pohl et al. "Sodium 3-Trimethylsilyltetradeuteriopropionate, a New Water-Soluble Standard for 1H-NMR." Angewandte Chemie. International Edition, DE., vol. 8, No. 5, May 1969, pp. 381-381.
Japanese Office Action dated Apr. 22, 2022, of corresponding Japanese Patent Application No. 2020-570638.

* cited by examiner

METHOD FOR HETERONUCLEAR QUANTITATIVE DETERMINATION BY NMR SPECTROSCOPY, REFERENCE SUBSTANCES THEREFOR AND METHOD FOR DETERMINING THE DEGREE OF DEUTERATION OF A DEUTERATED COMPOUND

The present invention relates to a method for the quantitative determination of an analyte in a test item using a NMR spectrometer, wherein the deuterated solvent used to dissolve the analyte is used as an internal standard, reference substances for use in the method according to the invention, and a method for determining the degree of deuteration of a deuterated compound.

Nuclear magnetic resonance spectroscopy, also referred to as NMR spectroscopy in the following, is one of the basic methods for the structure elucidation of organic compounds. It is based on the fact that the atomic nuclei of a large number of elements have a nuclear spin other than zero and the resulting angular momentum under an applied external magnetic field allows statements to be made about the chemical environment of the atom.

Atoms with a nuclear spin of zero (I=0), such as $^{12}C$ or $^{16}O$, cannot be detected by NMR spectroscopy. In contrast, all atoms with a nuclear spin other than zero are accessible to NMR spectroscopy. A value of ½ for the nuclear spin I is most advantageous, since in this case only two possible eigenstates exist, m=+½ and m=−½. The number of possible states is calculated according to the formula: 2I+1. When NMR spectroscopy is used in organic chemistry, the nuclei $^{1}H$, $^{13}C$, $^{15}N$, $^{19}F$, $^{29}Si$, $^{31}P$ and $^{77}Se$ are therefore the most suitable.

In addition to pure structure elucidation, NMR spectroscopy can also be used for the quantitative determination of a compound to be investigated, i.e. an analyte. In quantitative NMR spectroscopy, the amount of analyte contained in the sample solution is calculated by comparing the signal intensities of the analyte and a simultaneously measured reference substance. Usually, an internal standard is added to the sample solution as a reference substance, the purity of which is known and the signals of which should not overlap with those of the analyte. The reference substance can also be used as an external standard. In the following, a reference substance used in NMR spectroscopy is also referred to as a "standard".

In the quantitative evaluation of a NMR spectrum, the signals of the analyte and the reference substance are integrated separately. It is assumed that each atom whose signals appear in the spectrum contributes an equal share to the integrals of the signals, so that the number of atoms is proportional to the integrals, i.e. the integral areas. The mass of the analyte contained in the sample solution can be calculated from the ratio of the integrals and by taking into account the masses and molar masses of the analyte and reference substance and the number of atoms whose signals have been integrated.

In contrast to other chromatographic methods, quantitative NMR spectroscopy does not require that the reference substance used as a standard is identical to the analyte to be determined. The analyte and the standard need only contain the same type of atom (the same nuclide) whose signals are recorded in the NMR experiment. This makes it possible to use an internal standard as mentioned above, wherein this internal standard is ideally chosen so that in the NMR spectrum its signals do not overlap with the signals of the analyte. Defined amounts of the analyte and standard (determined by measuring or weighing) are dissolved in a sufficient amount of a usually deuterated solvent and then measured in the NMR spectrometer. For this method, the exact amount of solvent used need not to be known.

For each nucleus to be examined there are more or less suitable standards (standard substances) which are usually kept in stock as precisely defined standard solutions. If additional nuclide types are to be measured for the same sample, additional standards have to be added, which is time-consuming, since exactly defined standard solutions have to be prepared and precisely dosed. Moreover, these additional standard solutions must also be regularly checked for their purity, which represents an additional effort.

In order to reduce the number of different standards and the workload and to provide a universal standard for the most important NMR-active nuclides of organic molecules, a multi-nucleus standard was proposed in DE 10 2012 204 701 A1, which in addition to carbon and hydrogen atoms contains phosphorus, nitrogen and fluorine atoms. By using a single standard, several types of nuclides can be measured on the same sample without further intervention. A further advantage of the multi-nucleus standard is the fact that all types of atoms contained therein are always present in exact stoichiometric proportions, so that no weighing errors can occur when the ratio of the atoms in the standard is to be determined.

However, if the measurement of other active nuclei, especially from the range of inorganic anions and cations such as sodium (Na), potassium (K), chlorine (Cl), bromine (Br) or aluminum (Al) is desired, there are no suitable substances available for use as standards. Na is present only as a simple cation, as is K or Ca. The species iodine (I), Br and Cl are only stable as anions in an aqueous or organic solution. Only Cl can in principle be used as an internal standard in the form of a perchlorate. In contrast, periodate is too reactive in the presence of iodide to be determined and can therefore only be used as an external standard, which has corresponding disadvantages. In this case, calibration lines have to be established, which leads to many tedious reference measurements. Another fundamental problem with external calibration in NMR spectroscopy is that no measuring cells with a defined volume are available. In HPLC chromatography, for example, such cells are used for UV detection, where either a permanently available measuring cell or cuvettes standardized for replacement are used. The volume of commercially available NMR measuring tubes is not standardized and, depending on quality, gives an error of 0.5 to 10%. Alternatively, the same tube could be used for each measurement, but this leads to time-consuming rinsing and quality checks and is not practical, especially for series and routine measurements.

In all attempts in the past to overcome these shortcomings, respective quantitative determinations required at least a second measurement with a high uncertainty factor. The ERETIC procedure (electronic reference to access in vivo concentrations) tried to use an irradiated electronic reference signal for quantification. However, this failed due to the problem of volume variation. Even with the PULCON (pulse length based concentration determination) method, no more accurate results could be obtained than being allowed by the standard deviation of the mean volume of the NMR tubes. A second problem is that each NMR tube must be individually tuned with respect to sensitivity, the so-called "tuning and matching". Volume variation and matching cause a large measurement uncertainty.

It is therefore the object of the present invention to overcome the deficiencies in quantitative NMR spectroscopy described above and to provide a nuclear magnetic resonance spectroscopy method, i.e., a NMR spectroscopic method, with which all NMR-active nuclides can be quantitatively determined in a simple yet accurate manner. A further object of the present invention is to provide necessary defined reference substances for use in the NMR spectroscopic method.

This task is solved with the method for the quantitative determination of an analyte in a test item using a NMR spectrometer. The method according to the invention comprises the following steps:

providing a sample solution by dissolving a defined amount of the test item in a defined amount of a deuterated solvent, calibrating the NMR spectrometer by determining a calibration factor related to a first and a second NMR-active nuclide, wherein the first NMR-active nuclide is a constituent of the deuterated solvent and the second NMR-active nuclide is a constituent of the analyte;

generating a first spectrum by performing a first NMR experiment on the sample solution to determine the resonance frequencies of the first NMR-active nuclide;

generating a second spectrum by performing a second NMR experiment on the sample solution to determine the resonance frequencies of the second NMR-active nuclide, and calculating the mass of analyte in the sample solution taking into account the signals in the first and second spectra and taking into account the calibration factor, wherein the first NMR-active nuclide and the second NMR-active nuclide are different from each other, the calibration factor is determined by determining the resonant frequencies of the first NMR-active nuclide and the second NMR-active nuclide in a calibration solution containing known amounts of the first NMR-active nuclide and the second NMR-active nuclide, generating two calibration spectra and comparing the signals of the first NMR-active nuclide and the second NMR-active nuclide in the calibration spectra, and the first and the second NMR experiments and the determination of the calibration factor are carried out using the same NMR spectrometer.

The present invention is based on the finding of the inventors that in quantitative NMR spectroscopy the deuterated solvent used to prepare the sample solution can also be used as an internal standard and by this all NMR-active nuclides in the sample solution can be quantitatively determined. Thus, the method according to the invention can also be used for quantitatively detecting a nuclide that is not a constituent of the standard used. In the following, this approach is also referred to as "heteronuclear quantitative determination" or "heteronuclear quantification".

It is therefore characteristic for the method according to the invention that the first NMR-active nuclide and the second NMR-active nuclide are different from each other. The designation "first" or "second" NMR-active nuclide serves only to distinguish between the two different NMR-active nuclides.

Thus, the present invention is in contrast to the usual practice of quantitative NMR spectroscopy, in which the same nuclide is quantitatively detected both in the standard used and in the analyte to be determined. For distinction, the usual quantitative NMR spectroscopy can therefore be described as "homonuclear quantitative determination" or "homonuclear quantification".

NMR-active nuclides within the meaning of this application are all nuclides, i.e. atomic nuclei, of mononuclide elements or different isotopes of an element, which have a nuclear spin other than zero and thus can be detected by NMR spectroscopy.

The method according to the invention serves to determine the proportion of a certain substance (analyte) in a mixture of several substances (test item).

In order to be able to make a quantitative statement with the method according to the invention, a defined quantity of the test item must be dissolved in a defined quantity of a deuterated solvent when preparing the sample solution to be measured. The defined quantities of test item and deuterated solvent can be obtained independently of each other by measuring a desired volume or weighing a desired mass. It is therefore known which masses of test item and deuterated solvent are contained in the sample solution.

By specifying that the test item is dissolved in the deuterated solvent means that the test item is preferably completely dissolved in the solvent. However, it is also sufficient that only the analyte contained in the test item is completely dissolved.

The sample solution is preferably provided in a container suitable for performing NMR spectroscopy, such as a NMR tube.

As deuterated solvents $D_2O$, $DMSO-d_6$, $CDCl_3$, acetone-$d_6$, acetonitrile-$d_3$, benzene-$d_6$ can preferably be used, but in principle all deuterated solvents can be used. The deuterated solvent used can be suitably selected based on various parameters, such as the solubility of the test item or analyte in the solvent or an inert behavior of the solvent.

In the method according to the invention, two NMR experiments are carried out on the prepared sample solution, in which resonance frequencies of the first NMR-active nuclide and the second NMR-active nuclide are determined separately and the results are presented in corresponding NMR spectra. The order in which the first and the second NMR experiments are performed is in principle irrelevant. However, the two NMR experiments must be performed on the same sample solution. This means that the ratio of the proportions of deuterated solvent and analyte in the sample solution must neither change nor be altered between the two NMR experiments. Only then, a quantitative statement can be made regarding the amount of analyte in the test item.

The statement that a NMR-active nuclide "is a constituent of the deuterated solvent" means that this nuclide is represented in the formula (total molecular formula) of the solvent. Similarly, the statement that a NMR-active nuclide "is a constituent of the analyte" means that this nuclide is represented in the formula (total molecular formula) of the analyte. For example, if $D_2O$ is used as deuterated solvent, then deuterium ($^2H$) is a constituent of the deuterated solvent. If the analyte is for instance ethanol ($C_2H_5OH$), then carbon (C) and hydrogen (H) are both constituents of the analyte.

This does not exclude, however, that one or both of these nuclides are represented in both sum formulas. If, for example, a quantitative determination of an organic hydrocarbon compound using acetone-$d_6$ as deuterated solvent is carried out with the method according to the invention, carbon (C) is a constituent of both the deuterated solvent and the analyte.

The two NMR experiments are carried out as such in the usual manner and corresponding NMR spectra are generated from the results, one in which the signals of the NMR-active nuclide of the deuterated solvent used as internal standard are shown and one in which the signals of the NMR-active nuclide of the analyte are shown. For example, a $^2H$ NMR spectrum can be generated/prepared in the first NMR experiment and a $^1$H NMR spectrum or a $^{13}$C NMR spectrum can be generated/prepared in the second NMR experiment.

In contrast, in the usual homonuclear quantitative determination, only a single NMR experiment is carried out and only a single spectrum is obtained, in which both the signals of the internal standard and those of the analyte are represented.

For the quantitative determination of the analyte in the test item, measurement results from two different NMR experiments are thus used in the method according to the invention. The two NMR experiments differ in that the resonances of different nuclides are determined at different resonance frequencies. For a quantitative statement, the measurement results obtained in this way, i.e. the integrals of signals from different spectra, cannot be directly compared, which is explained in the following.

A phenomenon due to quantum physics is the different sensitivities of different nuclei due to the different resonance frequencies at the same magnetic field strength. This effect is quantified by the gyromagnetic ratio γ of the nuclides detected by NMR spectroscopy and expressed in the form of sensitivity values. These values are generally known. For example, $^1$H is the most sensitive nuclide. The next most sensitive nuclide is $^{19}$F, which is already 17% less sensitive than $^1$H. The sensitivity of $^2$H is already only about 1% ($9.65 \times 10^{-3}$) compared to $^1$H.

Insofar as the NMR-active nuclides investigated are not the only naturally occurring isotopes of this element, also the relative frequency of the investigated nuclide in the naturally occurring isotope mixture plays a role. This factor is taken into account in the receptivity, which is the product of the sensitivity and natural frequency of the nuclide. The nuclei $^{31}$P, $^{19}$F and $^{23}$Na, for example, are 100% monoisotopic. Without a significant error, $^1$H can likewise be regarded as monoisotopic. On the other hand, the natural frequencies of the nuclei $^{15}$N and $^{13}$C, for example, must be taken into account. These values are generally known.

The deuterated solvents used as internal standard in the method according to the invention are usually highly enriched in terms of the deuterium content, with deuteration degrees of between 99.5% and 99.99%, i.e. almost 100%. Alternatively, using the method according to the invention the degree of deuteration of the solvent used can be determined easily, quickly and reliably by comparing the $^1$H signal with the $^2$H signal (and by knowing the corresponding calibration factor).

If a $^2$H NMR spectrum is generated during the first NMR experiment and in case the deuteration level is about 100%, the receptivity for the measurement of NMR signals of $^2$H is about $9.65 \times 10^{-3}$ with regard to a measurement of NMR signals of $^1$H.

In addition to the quantum mechanical and chemical factors mentioned above, a device-specific factor also makes it difficult for directly comparing the measurement results from different NMR experiments. This factor is caused by the geometry of the measuring apparatus and is individual but specific to each NMR spectrometer, even if different instruments of the same design are compared. Thus, it showed that the coil geometry and other hardware parameters of a spectrometer have a recognizable influence. Therefore, the device-specific factor has to be determined empirically for each NMR spectrometer, which is not very complicated. It remains constant as long as no changes are made to the measuring apparatus. The determination of the device-specific factor can be carried out as part of a system suitability test (SST).

In order to take into account the device-specific factor, it is necessary to calibrate the NMR spectroscope used in the method according to the invention. For this purpose, a calibration factor is determined for each NMR spectrometer and for each nuclide pair consisting of first NMR-active nuclide and second NMR-active nuclide.

In particular, the calibration factor can be determined as follows. First, a suitable calibration solution is prepared. This solution contains known quantities of the first NMR-active nuclide and the second NMR-active nuclide. To determine a calibration factor for the nuclide pair $^1$H, $^2$H, for instance, a solution of $H_2O$ in $D_2O$ would be suitable from which the exact quantities of $H_2O$ and $D_2O$ contained therein are known.

By using the NMR spectrometer to be calibrated, a $^1$H NMR spectrum and a $^2$H NMR spectrum are then generated from the calibration solution.

By comparing the integrals of the respective peaks in the two spectra and taking into account the known amounts of $H_2O$ and $D_2O$ in the calibration solution, then the calibration factor being specific for this NMR spectrometer and this nuclide pair can be calculated.

The procedure for determining the calibration factors between D and all other active nuclei X can be further simplified by using specially synthesized compounds. These compounds contain both nuclei D and X in quantities defined by the nature of the chemical structure of the compounds and thus in defined molar ratios. Since the ratios are known, there is no need to weigh the sample. Such a reference substance can be added in any quantity to the analysis solution consisting of weighed sample and deuterated solvent. From the ratio of the absolute integrals of the specific signals for D and X, the calibration factor is determined in each individual measurement ab initio. Examples of suitable chemical compounds, such as isobutanol-$d_6$, are listed below.

This calibration factor takes into account not only the device-specific factor of the NMR spectrometer used but also the above-mentioned chemical and quantum mechanical factors of the nuclide pair used. Since the calibration factor also takes into account device-specific properties, in the procedure according to the invention the first and second NMR experiments and the determination of the calibration factor must be carried out by using the same NMR spectrometer.

Thus, the present application also discloses a method for calibrating a NMR spectrometer for carrying out the method of heteronuclear quantitative determination according to the invention.

The calibration of the NMR spectrometer can be performed before or after the first and second NMR experiments are performed.

Finally, in the method according to the invention, the mass of analyte contained in the sample solution is calculated taking into account the signals in the first and second spectra and taking into account the calibration factor. This will be explained in detail later.

In the method according to the invention, it is preferred that the NMR-active nuclide, which is a constituent of the deuterated solvent and is referred to above as the first NMR-active nuclide, is $^2$H (the deuterium isotope of hydrogen).

This makes use of the fact that the deuterium atom $^2$H (or D) has a nuclear spin of 1 and can therefore be detected by NMR spectroscopy. Thus, any deuterated solvent can be used as an internal standard. It should be noted that the resonance frequency of $^2$H is significantly lower than that of $^1$H with a frequency ratio Ξ of 15.40% (in relation to the proton frequency at 0 ppm of TMS (tetramethylsilane) in CDCl$_3$).

As explained above, the sensitivity of $^2$H is relatively low and the receptivity for the measurement of $^2$H NMR signals is only about 1% (9.65×10$^{-3}$) in relation to a measurement of $^1$H NMR signals. However, this is compensated by the fact that in NMR spectroscopy the solvent is present in the sample solution in a significant excess.

If in the method according to the invention the first and the second NMR experiments are carried out in a pulsed manner, the number of pulses with which the first and the second NMR experiments were carried out must also be taken into account when comparing the signals from the two spectra (dividing the integral values by the number of pulses).

The greatest advantage of the method according to the invention is that the solvent is used as a reference standard or reference substance and additionally as an internal standard. This eliminates the problem of volume variation in NMR tubes mentioned at the beginning. Since a solvent is already commonly used in NMR spectroscopy, no additional substance needs to be added as a standard. The solvent, which also acts as a standard here, only needs to be measured accurately (for example, by measuring an exact volume or weighing an exact mass). This internal standard, i.e. the solvent, can also act as a lock-substance to improve frequency stability. Here, a preferred substance is for example D$_2$O. Thus, the internal standard acts simultaneously as solvent and additionally as lock-substance.

In addition, a single pulse is usually sufficient to calibrate the measurement, i.e. to record the $^2$H NMR spectrum, which results in only a minimal extension of the total measurement time of about 10 seconds for the entire measurement procedure.

In the following, it is explained in detail how a NMR spectroscopic examination of a test item can be used to make a quantitative statement regarding a compound, i.e. the analyte, contained in the test item for both the known homonuclear quantitative determination and the heteronuclear quantitative determination according to the invention. The variables and constants used are listed in Table 1.

TABLE 1

| Variable/constant | Meaning |
|---|---|
| $m_{IS}$ | Mass (weight-in quantity) of the internal standard |
| $m_{PG}$ | Mass (weight-in quantity) of the test item |
| $m_{RS}$ | Molecular weight of the reference substance |
| $M_A$ | Molecular weight of the analyte |
| $n_{RS}$ | Amount of substance of the reference substance |
| $n_A$ | Amount of substance of the analyte |
| $w_{RS}$ | Mass fraction of the reference substance in the internal standard (weight %) |
| $w_A$ | Mass fraction of the analyte in the test item (weight %) |
| $I_{RS}$ | Integral of the peak of the reference substance |
| $I_A$ | Integral of the peak of the analyte |
| $ZA_{RS}$ | Number of atoms of the peak of the reference substance*) |
| $ZA_A$ | Number of atoms of the peak of the analyte*) |
| $NS_{RS}$ | Number of pulses (number of scans) when recording the spectrum of the reference substance |
| $NS_A$ | Number of pulses (number of scans) when recording the spectrum of the analyte |
| X, Y | NMR-active nuclides whose resonances are measured (such as $^1$H, $^2$H; $^{13}$C, etc.) = nuclide pair |

TABLE 1-continued

| Variable/constant | Meaning |
|---|---|
| Factor (X, Y) | Device-specific calibration factor determined in advance by calibration measurements, which allows a comparability of the integrals in the spectra of the nuclides X and Y. |

*)number of atoms of the NMR-active nuclide causing in the NMR spectrum the peak used for quantitative determination.

Calculation for Homonuclear Quantitative Determination:

To prepare a suitable sample solution, a known mass of the test item $m_{PG}$ is weighed in together with a known mass of the internal standard $m_{IS}$ and dissolved in a suitable solvent. For example, the internal standard can be liquid, solid or a solution in a suitable solvent and contains the reference substance in a precisely known proportion, the mass fraction $w_{RS}$.

The structure of the reference substance is known. The structure of the analyte in the test item is usually also known or can be determined from the NMR spectrum. Thus, the individual signals/peaks visible in the obtained NMR spectrum can be clearly assigned to the reference substance and the analyte, respectively.

For both the reference substance and the analyte and for a selected peak in each case the integrals $I_{RS}$ and $I_A$ corresponding to the area under the respective peaks are determined. In addition, the number of atomic nuclei that have caused the respective peaks must be known. If, for example, dimethyl sulfone is used as a reference substance, its peak in a $^1$H NMR spectrum is caused by 6H atoms. If the peak of a single CH$_3$ group is used for quantitatively determining the analyte, the integral of this peak is the result of 3H atoms.

Using the following formula (1), the amount of substance $n_{RS}$ of the reference substance in the sample solution can be calculated using the weighed mass $m_{IS}$ of the internal standard, the mass fraction $w_{RS}$ of the reference substance in the internal standard and its molecular weight $M_{RS}$:

$$n_{RS} \ [\text{mmol}] = \frac{m_{IS} \ [\text{mg}] \times w_{RS} \ [\%]}{M_{RS} \ [\text{g/mol}] \times 100} \qquad (1)$$

Using the following formula (2), the amount of substance $n_A$ of the analyte in the sample solution can be calculated by comparing the integrals $I_A$ and $I_{RS}$ of one peak each of the analyte and the reference substance in the internal standard and by taking into account the number of atoms $ZA_A$ and $ZA_{RS}$, respectively, which caused the peaks:

$$n_A \ [\text{mmol}] = \frac{I_A \times ZA_{RS} \times n_{RS} \ [\text{mmol}]}{I_{RS} \times ZA_A} \qquad (2)$$

Using the following formula (3), the mass fraction $w_A$ of the analyte in the test item can be calculated from the amount of substance $n_A$ of the analyte in the sample solution, its molar mass $M_A$ and the weighed mass $m_{PG}$ of the test item:

$$w_A \ [\%] = \frac{M_A \ [\text{g/mol}] * n_A \ [\text{mmol}] * 100}{m_{PG} \ [\text{mg}]} \qquad (3)$$

Calculation for Heteronuclear Quantitative Determination:

To prepare a suitable sample solution, a known mass of the test item $m_{PG}$ is weighed in together with a known mass of the deuterated solvent $m_{IS}$ and dissolved therein. Since the deuterated solvent is used as internal standard, it is not necessary to add another substance to the sample solution.

From the sample solution, preferably a $^2$H NMR spectrum (with a suitable number of pulses $NS_{RS}$) and additionally a further NMR spectrum are recorded. The further NMR spectrum is usually a NMR spectrum suitable for the determination of the analyte (with a suitable number of pulses $N_{SA}$), such as a $^1$H or a $^{13}$C NMR spectrum.

Naturally, the structure of the deuterated solvent, i.e. the reference substance, is known. The structure of the analyte is usually also known or can be determined from the NMR spectrum. Thus, the individual signals/peaks visible in the NMR spectra obtained can be clearly assigned to the reference substance and the analyte, respectively.

For the reference substance and for a selected peak in the $^2$H NMR spectrum the integral $I_{RS}$ is determined. Similarly, the integral $I_A$ for a selected peak in the further NMR spectrum is determined. As in homonuclear quantitative determination, the number of atomic nuclei that caused the respective peaks must be known.

Using the following formula (1), the amount of substance $n_{RS}$ of the reference substance in the sample solution can be calculated using the weighed mass $m_{IS}$ of the internal standard, i.e. of the deuterated solvent, the mass fraction $w_{RS}$ of the reference substance in the internal standard and its molar mass $M_{RS}$:

$$n_{RS} \; [\text{mmol}] = \frac{m_{IS} \; [\text{mg}] \times w_{RS} \; [\%]}{M_{RS} \; [\text{g/mol}] \times 100} \tag{1}$$

The mass fraction $w_{RS}$ of the reference substance results from the purity and deuteration degree of the deuterated solvent and is known for the deuterated solvents available on the market.

Using the following formula (2a), the amount of substance $n_A$ of the analyte in the sample solution can be calculated by comparing the integrals $I_A$ and $I_{RS}$ of one peak each of the analyte and the reference substance in the internal standard and by taking into account the number of atoms $ZA_A$ and $ZA_{RS}$, respectively, which caused the peaks:

$$n_A \; [\text{mmol}] = \frac{[I_A \times \text{Factor}\,(X,Y)/NS_A] \times ZA_{RS} \times n_{RS} \; [\text{mmol}]}{[I_{RS}/NS_{RS}] \times ZA_A} \tag{2a}$$

Since in the NMR spectra the peak areas (integrals) increase with increasing number of pulses and a linear dependence can be assumed, the integrals $I_A$ and $I_{RS}$ in above equation (2a) are set in relation to the number of pulses $N_{SA}$ and $NS_{RS}$ (number of scans), respectively.

Furthermore, equation (2a) takes into account the Factor (X,Y) which can be determined by a calibration measurement. Here, X and Y denote the respective nuclei in the sample solution that are detected in the two NMR spectra, such as $^2$H and $^1$H.

Using the following formula (3), the mass fraction $w_A$ of the analyte in the test item can be calculated from the amount of substance $n_A$ of the analyte in the sample solution, its molar mass $M_A$ and the weighed mass $m_{PG}$ of the test item:

$$w_A \; [\%] = \frac{M_A \; [\text{g/mol}] * n_A \; [\text{mmol}] * 100}{m_{PG} \; [\text{mg}]} \tag{3}$$

In the method according to the invention, the first and second NMR experiments and the determination of the calibration factor must be carried out using the same NMR spectrometer. Preferably, all other parameters of the respective NMR experiments, which have an influence on the integrals of the peaks, are likewise retained unchanged during these measurements. Alternatively, the change in some of these parameters can be mathematically taken into account and corrected.

A corresponding parameter with which the conversion of analog signals into digital signals can be optimized is the so-called RG (receiver gain). This parameter is preferably set to 1 for NMR experiments. In principle, the integral used for evaluation is a linear function of RG, so that mathematical corrections are possible for different RGs. A correction with respect to RG must be taken into account in equation 2a above.

Another relevant parameter in a NMR experiment is the pulse angle PW. In the fully relaxed state, the sum of the Z magnetization due to the nuclear spins is normalized to 1. The intensity of the X,Y magnetization is a function of the duration of the excitation, which is normally in the range of 10 to 200 µsec. By this, the Z vector is brought into a circular motion. Depending on the excitation duration, the vector is also called pulse angle. The maximum intensity of the excitation is achieved by a 90° pulse, 100% of the Z magnetization is converted into X,Y magnetization. Doubling the excitation time results in a negative Z magnetization, the X,Y magnetization is 0. In this case, the macroscopic magnetization of the excited nuclear spins describes a unit circle. In the vector field, the intensity in X,Y is a sine function. For mathematically obvious reasons, any error that may occur due to inaccurate pulse angle settings or pulse times is lowest for a 90° pulse. Therefore, the 90° pulse is preferred for the heteronuclear quantification according to the invention. Otherwise, a correction of the absolute integrals would have to be made. In the homonuclear case of quantification, the PW does not play a role, since it is mathematically reduced from the equation.

Another parameter is the so-called relaxation delay D1. It defines the experimental waiting time between two pulses (NS>1) and must therefore only be considered for the case NS>1. This value must be so large that a complete relaxation of both measured nuclides is ensured. The relaxation time is a material property and thus individual for all nuclides and also within a homonuclear group in different molecular environments. This parameter has to be observed for each quantification and cannot be considered mathematically. In addition to the classic T1 measurement, there is a simple test using a single 90° pulse that follows the NMR experiment without a D1, which can be used to check whether the relaxation delay D1 was sufficiently large.

With the method according to the invention, NMR spectroscopy can be raised to the level of a primary quantitative measuring method and thus be equated with weighing. Like a balance, a NMR experiment only needs to be calibrated.

In the field of the analysis of ionic active pharmaceutical ingredients, the anions or cations to be analyzed can be determined both qualitatively and quantitatively with a single NMR spectroscopic analysis, for example.

The principle of using a deuterated solvent as an internal standard, which underlies the present invention, also allows to quickly and easily determine the degree of deuteration of a deuterated compound.

The degree of deuteration of a compound is usually given in percentage (%) and indicates the proportion of hydrogen atoms in the compound that are replaced by a deuterium atom.

Likewise, a degree of protonation can be defined, where: degree of deuteration=1−degree of protonation.

According to the invention, a method for determining the degree of deuteration of a first deuterated compound can thus also be provided, the method comprises the steps:

preparing a mixture of the first deuterated compound and a second deuterated compound whose degree of deuteration is known, so that both deuterated compounds are dissolved;

generating a $^1$H NMR spectrum from the mixture and determining the integrals of at least one peak of each of the two deuterated compounds;

generating a $^2$H NMR spectrum from the mixture and determining the integrals of the same peaks;

calculating the degree of deuteration of the first deuterated compound using the determined integral values and the known degree of deuteration of the second deuterated compound.

According to a preferred embodiment, at least one of the first and second deuterated compounds is a deuterated solvent for NMR spectroscopy.

The mixing ratio of the first and second deuterated compounds does not need to be known exactly as long as meaningful NMR spectra can be obtained. Preferred mixing ratios by weight are between 1:99 and 99:1, further preferred between 10:90 and 90:10 and especially preferred between 30:70 and 70:30. The easiest and therefore especially preferred is to mix the first and second deuterated compound in a ratio of about 1:1.

From the two spectra, the integrals of the same peaks of the first and second compounds are determined and an integral ratio D/H is calculated for each of the two compounds. Using the calculated integral ratios and taking into account the known degree of protonation of the second deuterated compound, the degree of protonation and from this, the degree of deuteration of the first deuterated compound can be calculated by means of equation (4).

$$\{D\}_{Vb1}=100-(\{H\}_{Vb2}\times(IntH_{Vb2}/IntD_{Vb2})/(IntH_{Vb1}/IntD_{Vb1}) \quad (4)$$

wherein:

$\{D\}_{Vb1}$=degree of deuteration of the first deuterated compound $\{H\}_{Vb2}$=degree of protonation of the second deuterated compound $IntH_{Vb1}$=Integral of a peak of the first deuterated compound in the $^1$H NMR spectrum $IntD_{Vb1}$=Integral of the same peak of the first deuterated compound in the $^2$H NMR spectrum $IntH_{Vb2}$=Integral of a peak of the second deuterated compound in the $^1$H NMR spectrum $IntD_{Vb2}$=Integral of the same peak of the second deuterated compound in the $^2$H NMR spectrum

The advantage of this method for determining the degree of deuteration is, among other things, that neither an exact mixing ratio needs to be known, nor do the quantum mechanical, chemical or device-specific factors mentioned above need to be known. In particular, the method can be used to easily and accurately determine the deuteration degrees of solvents for NMR spectroscopy.

In the method for heteronuclear quantitative determination by NMR spectroscopy according to the invention, a one-time calibration of the NMR spectrometer used is necessary, as mentioned above. The calibration solution required for this purpose contains known quantities of the first NMR-active nuclide and the second NMR-active nuclide and thus can be prepared by exactly measuring the two suitable compounds.

Alternatively, a compound can be used for the calibration that contains a defined number of the two nuclides in its structural formula. For example, in the case of $^1$H and $^2$H as the two nuclides, a suitable compound would be isopropanol-d$_6$, (CD$_3$)$_2$CHOH, which is obtainable by reduction of acetone-d$_6$. As this compound has a well-defined and constant ratio of the nuclides $^2$H and $^1$H of 6:2, the need for accurate measurement is eliminated when using this compound as a reference substance.

Based on this, further chemical compounds are conceivable which, in addition to a defined number of deuterium atoms, contain one or more further nuclides, which are detectable by NMR spectroscopy, such as carbon, nitrogen, phosphorus, fluorine, silicon, boron, selenium, etc.

Examples of such compounds that can be used as reference substances in calibration are phosphoric acid esters of isopropanol-d$_6$:

wherein the phosphorus may also have other oxidation states (such as phosphonic acid esters).

The residue R can be chosen in such a way that other NMR active nuclei, especially fluorine, silicon and boron, become part of the reference substance. In the case of R=isopropyl-d$_6$, a compound is obtained which is only suitable as a reference substance for calibration in the determination of deuterium, hydrogen and phosphorus. For the following compounds, the radical R was selected in such a way that the reference substance also contains a defined number of fluorine atoms, so that reference substances are accessible which are also suitable for calibration when determining fluorine-containing compounds:

-continued

Based on the principle of the method for heteronuclear quantitative determination by NMR spectroscopy according to the invention, it is additionally provided the use of such compounds as described above, i.e. compounds which contain in their structural formula a defined number of deuterium atoms and a defined number of at least one further nuclide which can be detected by NMR spectroscopy, for calibration of a NMR spectroscope for heteronuclear quantitative determination.

As explained above, the present application also discloses a method for calibrating a NMR spectrometer for carrying out the method of heteronuclear quantitative determination according to the invention. Thus, the use of the compounds described above in such a calibration method is likewise disclosed.

It is particularly preferred that the chemical compound used as a reference substance is liquid at room temperature or at slightly elevated temperature. This makes it easier to use the compound as a pure substance.

The quantitative heteronuclear NMR spectroscopy now only refers to a purely mathematical basis that is traceable to the natural stoichiometry of defined organic molecules. This system can be described as a quantum balance, thus a primary absolute analytical method, which in its practical application becomes a primary relative method.

With the method according to the invention, it is possible to perform quantitative NMR spectroscopy without the addition of a specific standard substance, which has been used until now.

An important area for such "standard-free analysis" is diagnostics or forensics. The use of the solvent $D_2O$ as a reference can, for example, significantly improve the determination of blood alcohol compared to conventional methods. Regarding the determination of the blood alcohol concentration by NMR spectroscopy, reference is made to patent DE 10 2012 224 334 B4.

In analogy to the determination of the deuteration degree of solvents described above, the combined $^1H/^2H$ NMR method allows the direct determination of the water content in blood and plasma samples. The content of ethanol as blood alcohol in a blood sample can thus be determined directly without the need for a common standard and only a single determination is required.

In addition to the quantitative determination of water and blood alcohol in the blood, further important parameters of the blood composition become directly accessible, i.e. can be quantitatively determined in a simple and accurate way, by the method according to the invention. These include inter alia glucose, lactic acid, specific amino acids or ADP/ATP. The signals of the complex lipoproteins, which are a clear sign of the identity of human blood, can also be detected and form a spectroscopic fingerprint, which, especially in forensic samples, confirms the identity and quantity of the examined material as human blood. In an analogous manner by using suitable measurement conditions, other metabolites can be detected including gamma-hydroxybutyric acid known as liquid ecstasy.

Further advantages and features of the present invention can be seen from the description of embodiments as well as from the drawings, wherein.

EXAMPLE 1—DETERMINATION OF SODIUM IN SODIUM HEPARIN

In the following, the determination of sodium in sodium heparin is presented as an example of the method according to the invention, i.e. the heteronuclear quantitative determination.

For this purpose, the sodium content of 16 different samples (S1-S16) of Na-heparin solutions was determined by means of the method according to the invention (NMR) and compared with the values obtained in a determination normally used for this purpose by means of atomic absorption spectroscopy (AAS).

To prepare the samples, defined amounts of Na-heparin are weighed in and dissolved in defined volumes of $D_2O$. Alternatively, the defined quantities of a suitable deuterated solvent can also be weighed. As a deuterated solvent, DMSO-$d_6$ can be used as an alternative to $D_2O$.

Specifically, the Na determinations by NMR in accordance with the invention were carried out as an additional experiment following the $^1H$ NMR investigation required by the European and US American Pharmacopoeias. For this purpose, the already existing sample solutions could be used without an additional sample preparation, so that the additional time required was only about 2 minutes per measurement.

Figure 1:
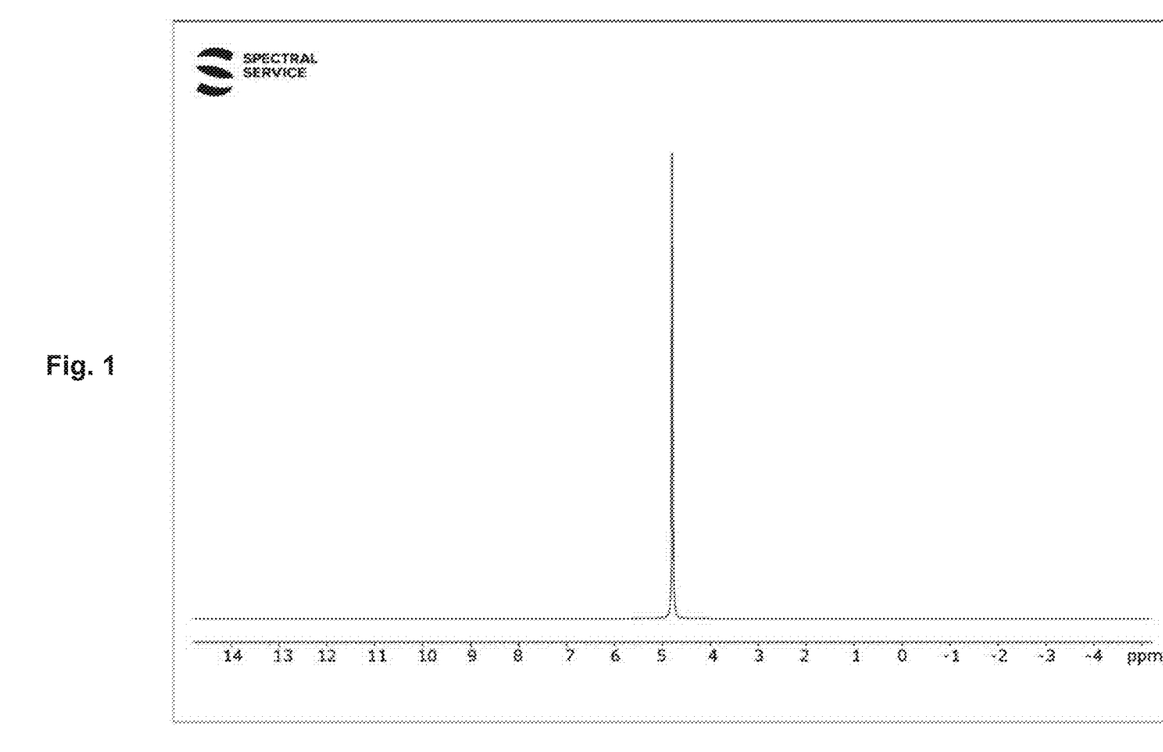
FIG. 1 shows a $^2H$ NMR spectrum of Na-heparin in $D_2O$.

The time required for the NMR experiment to produce a $^2H$ NMR spectrum was less than seconds. An exemplary $^2H$ NMR spectrum of Na-heparin in $D_2O$ is shown in FIG. 1. It was generated with a 500 MHz spectrometer of the type Prodigy (manufactured by Bruker Corporation) with one pulse. The signal-to-noise ratio S/N is 17000.

Figure 2:
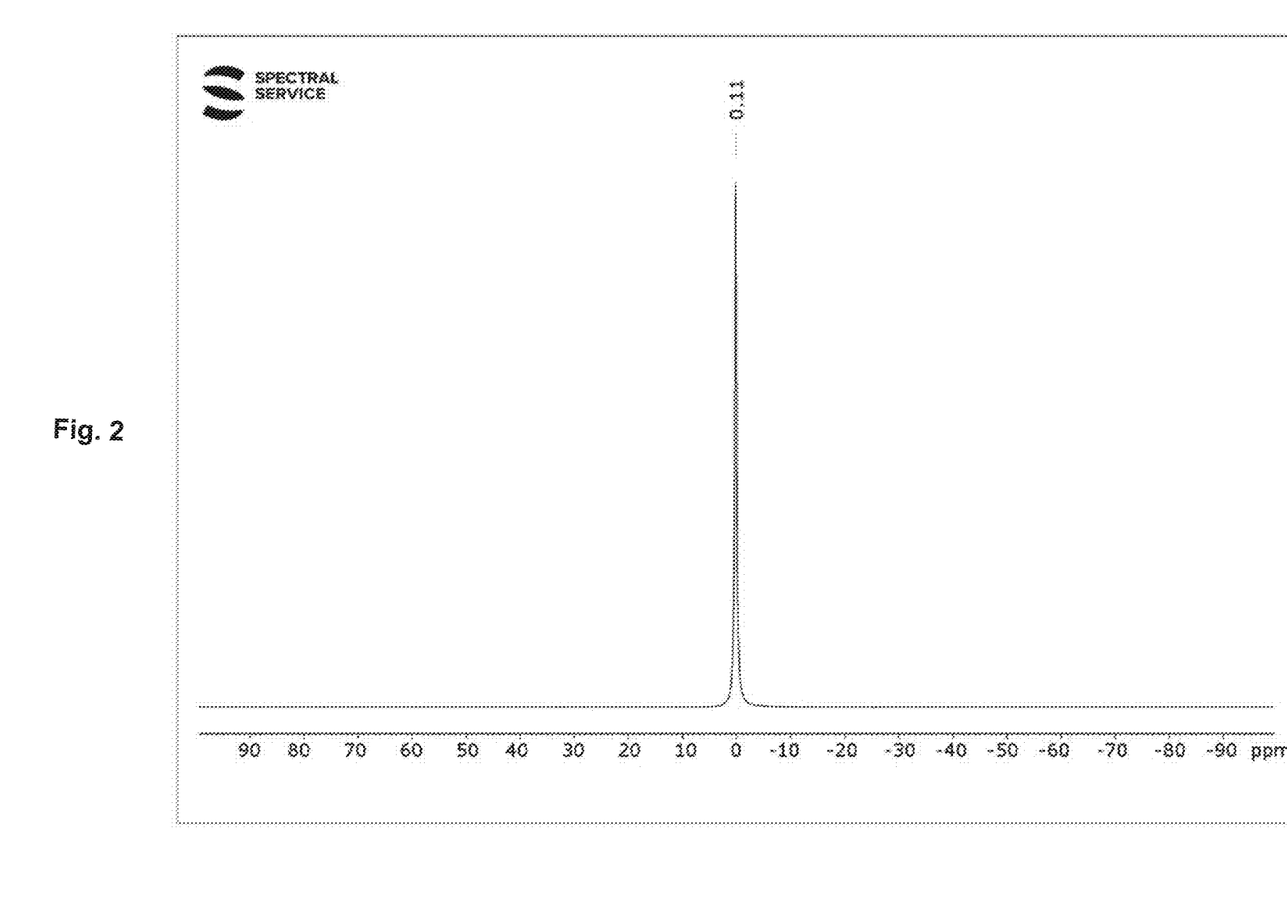
FIG. 2 shows a $^{23}Na$ NMR spectrum of Na-heparin in $D_2O$.

The time required for the NMR experiment to produce a $^{23}Na$ NMR spectrum was about 2 minutes. An exemplary $^{23}Na$ NMR spectrum of Na-heparin in $D_2O$ is shown in FIG. 2. It was generated with the same 500 MHz spectrometer of the type Prodigy (manufactured by Bruker Corporation) with 128 pulses. The signal-to-noise ratio S/N is 4900.

Figure 3:
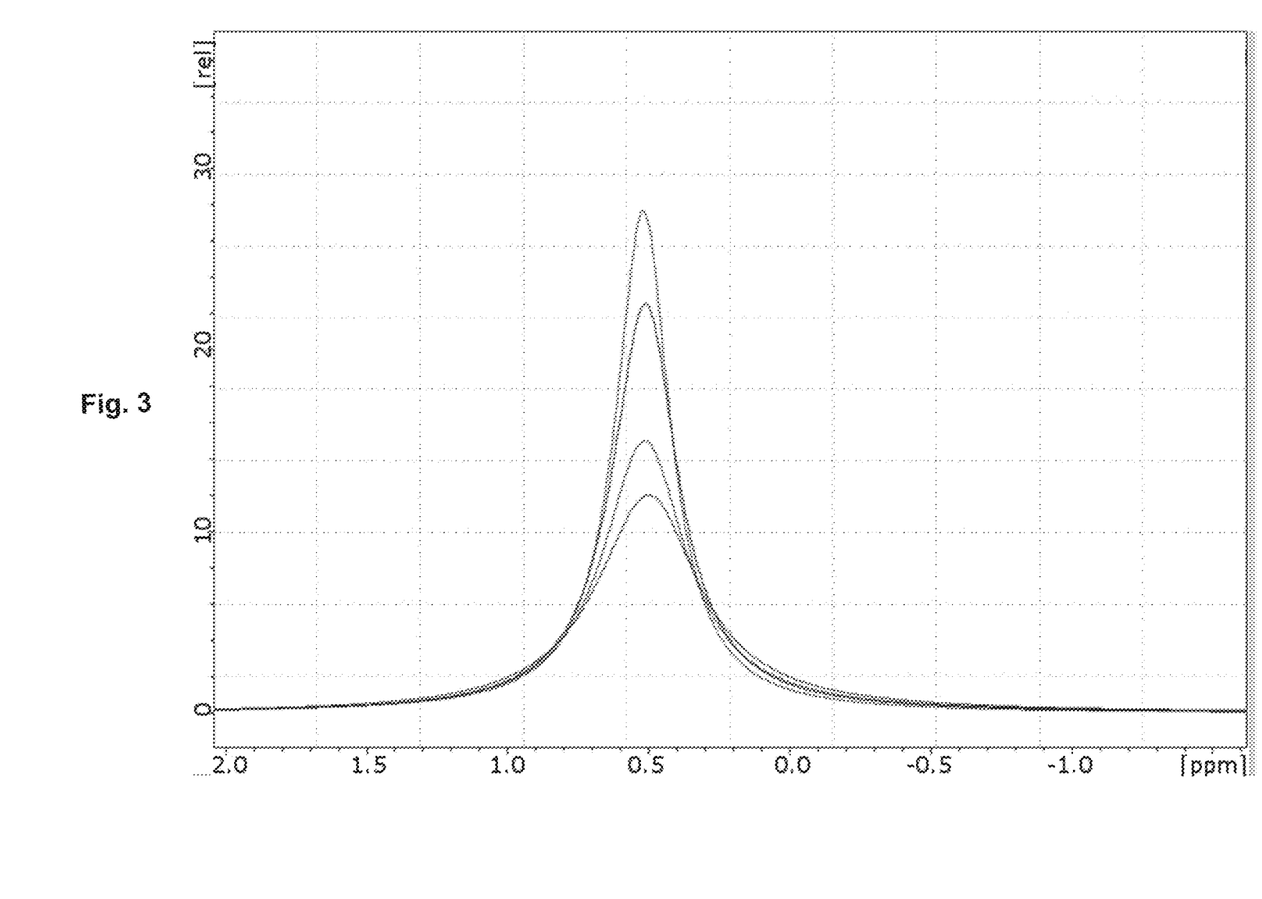
FIG. 3 shows a $^{23}Na$ NMR spectrum with different concentrations of Na heparin.

In the $^{23}$Na NMR spectrum shown in FIG. 3, the Na signals of different samples with different concentrations of Na heparin are superimposed.

Based on the signals (integrals) in the respective $^2$H NMR and $^{23}$Na NMR spectra and taking into account the calibration factor for the NMR spectrometer used and the nuclide pair ($^2$H, $^{23}$Na), the content of Na in each of the samples was determined.

The following Table 1 shows the results obtained with the method according to the invention in comparison with the results from the determination by atomic absorption spectroscopy (AAS).

TABLE 1

| Sample | Content of Na in the sample [% by weight] | |
|---|---|---|
| | determined by NMR | determined by AAS |
| S1 | 10.2 | 11.9 |
| S2 | 12.4 | 12.2 |
| S3 | 13.1 | 12.0 |
| S4 | 13.1 | 11.8 |
| S5 | 11.3 | 12.1 |
| S6 | 12.1 | 11.6 |
| S7 | 12.9 | 12.0 |
| S8 | 13.5 | 11.6 |
| S9 | 11.6 | 11.8 |
| S10 | 12.3 | 11.5 |
| S11 | 10.5 | 11.1 |
| S12 | 11.9 | 12.0 |
| S13 | 11.4 | 11.5 |
| S14 | 11.0 | 11.6 |
| S15 | 11.9 | 11.8 |
| S15 | 11.4 | 11.6 |
| S16 | 11.1 | 11.6 |

It was found that, within the scope of the measuring accuracy, the results of the NMR examination are in agreement with those of the AAS method that is classically used for Na.

The procedure described above can be easily transferred to all other active NMR nuclei, for example $^{35}$Cl or $^{79}$Br.

EXAMPLE 2—DETERMINING THE DEUTERATION DEGREE OF A NMR SOLVENT

A solvent suitable for NMR experiments must contain a very high degree of deuterium $^2$H instead of the naturally more abundant hydrogen atom $^1$H. For a conventional NMR experiment, the specification "very high" is sufficient, i.e. >99% D. The remaining 1% is $^1$H.

To know this degree of deuteration is important for the method of heteronuclear quantitative NMR according to the invention. In the case of very high deuterated solvents such as D$_2$O with a degree of deuteration of >99.95%, the proportion of $^1$H at 0.05% is insignificant and plays a role only in determining the measurement uncertainty. For the exact determination of the deuteration degree, NMR spectroscopy is naturally well suited, since it can be used to measure both nuclides $^2$H (D) and $^1$H. The ratio of the integrals D/H is directly proportional to the deuteration degree. A necessary calibration can be carried out simply by adding the same non-deuterated solvent and performing a suitable calculation.

In the following, this is shown with the example of deuterated DMSO-d$_6$ (CD$_3$-SO-CD$_3$). According to the manufacturer, the deuteration degree of DMSOd$_6$ used in this example is about 99.5%. Thus, some of the DMSO molecules do not contain two identical CD$_3$ groups, but also a CD$_2$H or CDH$_2$ group. In the $^1$H NMR spectrum, the signals of the groups CD$_2$H (pentet due to a $^2$J$_{D,H}$-coupling) and CDH$_2$ (triplet due to a $^2$J$_{D,H}$-coupling) can be displayed separately (see FIG. 4). In the $^2$H NMR spectrum, only the dominant CD$_3$ group is visible (see FIG. 5).

Figure 4:
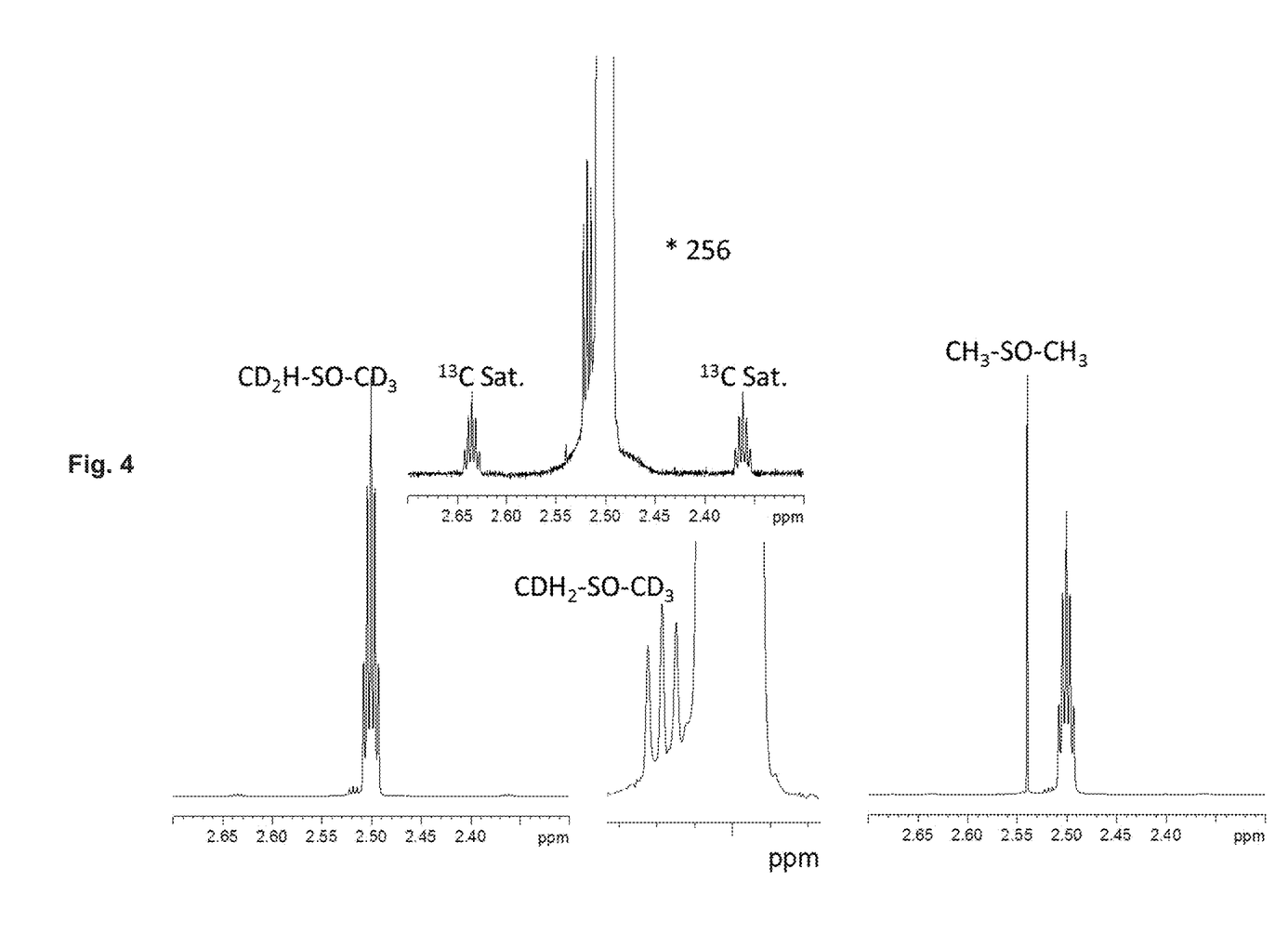
FIG. 4 shows a $^1H$ NMR spectrum of DMSO-$d_6$ with detail magnification.

In FIG. 4, a $^1$H NMR spectrum of DMSO-d$_6$ is shown on the left side. In the middle of FIG. 4, the triplet of the CHD$_2$ group is shown in a vertical magnification. After addition of non-deuterated DMSO to this sample, the singlet of the CH$_3$ groups appears shifted to deep field. The so-called deuterium isotope effects cause an equidistant shift of the $^1$H resonances by the same amount per deuterium to high field.

Since also the CH$_3$ group at the sulfur shows up as a separated signal (singlet due to missing $^2$J$_{D,H}$), the use of regular DMSO as internal standard and for standard addition is suitable in the present case to exactly determine the amount of protons in the DMSO-d$_6$. By knowing the amount of residual protons, which can be determined very precisely in this way, a calibration of the ratio of deuterium to hydrogen can be done easily. The deuterated solvent being exactly defined in this way with regard to the degree of deuteration can therefore be used as a standard for heteronuclear quantification in the method according to the invention.

Figure 5:
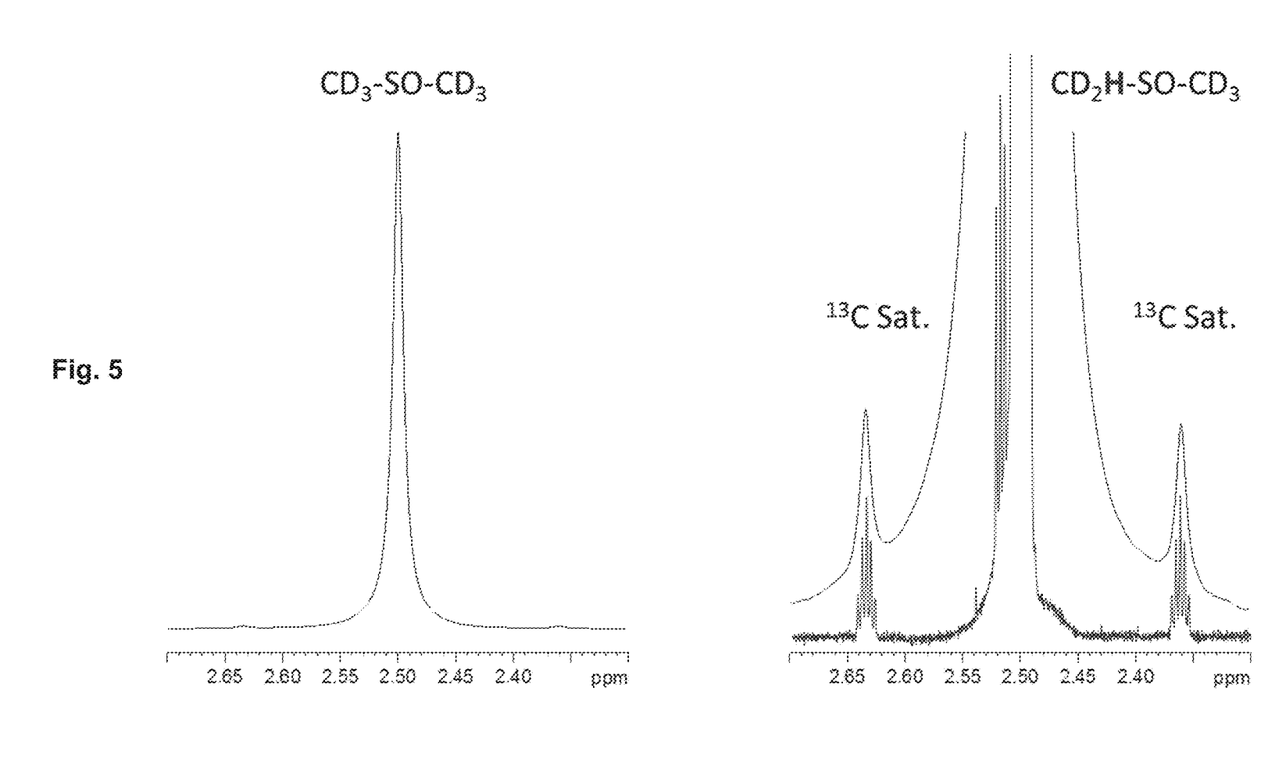
FIG. 5 shows a $^2H$ NMR spectrum of DMSO-$d_6$ (left) and in enlargement an overlay with the corresponding $^1H$ NMR spectrum of FIG. 4 (right).

FIG. 5 shows a $^2$H NMR spectrum of DMSO-d$_6$ on the left side and a magnified overlay of the corresponding $^1$H NMR spectrum from FIG. 4 on the right side. The right spectrum is vertically magnified to show the $^{13}$C NMR satellites.

After various defined quantities of non-deuterated DMSO have been added to the deuterated DMSO-d$_6$ used in this example, the mixtures obtained have each been measured by NMR spectroscopy and the ratios of the integrals D/H have been determined and then the ratios D/H obtained have been plotted against the proportion of added non-deuterated DMSO in % by weight, the degree of deuteration of the deuterated DMSO-d$_6$ used can be calculated from the linear correlation equation using the following equation (5).

$$\text{degree of deuteration} = 100 - \text{intercept/slope} \quad (5)$$

Figure 6:
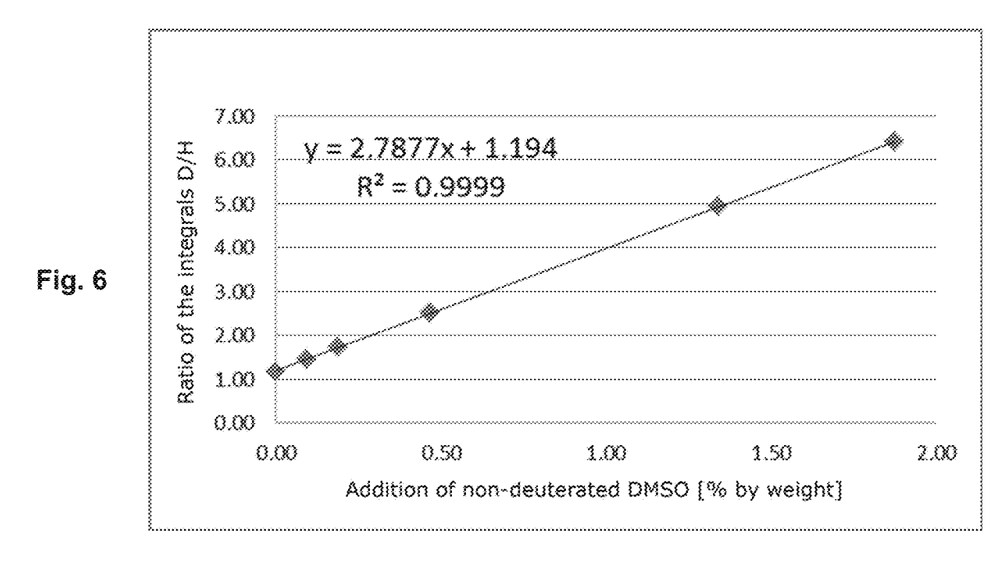
FIG. 6 shows a diagram to determine the deuteration degree of deuterated DMSO-$d_6$.

FIG. 6 shows a corresponding diagram with the measured values obtained according to this example and a straight line created using linear regression. The coefficient of determination $R^2$ was 0.9999. With the straight-line equation y=2.7877x+1.194 a deuteration degree of 99.57% is obtained for the deuterated DMSO-d$_6$ used.

A solvent that has been precisely specified with regard to the degree of deuteration as in example 2 above can now be used as a universal standard for determining the degree of deuteration of other deuterated solvents such as CDCl$_3$ and thus further standards for the method according to the invention (heteronuclear quantification) can be specified.

For this purpose, the solvent to be specified with regard to the degree of deuteration is mixed with the previously defined DMSO-d$_6$ and corresponding $^1$H and $^2$H NMR spectroscopic measurements are carried out. It is not necessary to know the mixing ratios, since all parameters influencing the measurement, such as quantity, individual instrument settings, etc., are put into perspective. This procedure is explained in detail in the following example 3.

EXAMPLE 3—DETERMINATION OF THE DEUTERATION DEGREE OF A NMR SOLVENT USING ANOTHER DEUTERATED SOLVENT WITH KNOWN DEUTERATION DEGREE

In present example 3, the deuteration degree of deuterated CDCl$_3$ is determined. For this, a mixture of deuterated CDCl$_3$ with the DMSO-d$_6$ used in example 2 (deuteration degree 99.57%) is prepared in an approximate mixing ratio of 1:1. Since the mixing ratio does not have to be known exactly, it can be weight-related or volume-related. Other mixing ratios can be used as long as meaningful NMR spectra can be obtained. The obtained mixture is measured by $^2$H and $^1$H NMR (one single pulse each).

Figure 7:
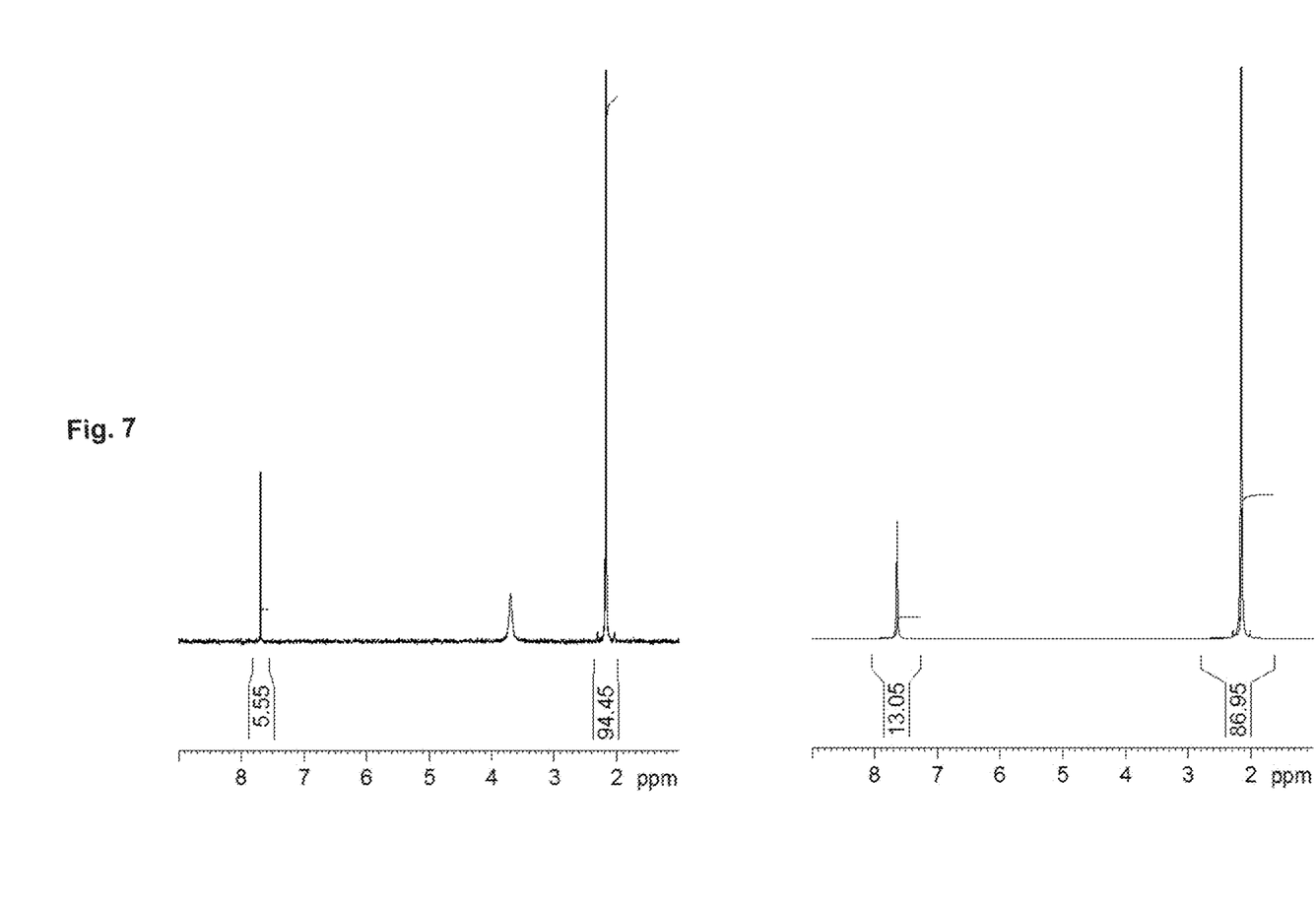
FIG. 7 shows a $^1H$ NMR spectrum of a mixture of DMSO-$d_6$ and CDCl$_3$ (left) and the corresponding $^2H$ NMR spectrum (right).

FIG. 7 shows on the left side a $^1$H NMR spectrum of the prepared mixture of DMSO-d$_6$ and CDCl$_3$ and shows on the right side the corresponding $^2$H NMR spectrum.

The ratio of the integrals D/H from the spectra of DMSO-d$_6$ is compared with the ratio of the integrals D/H from the spectra of CDCl$_3$ and, by taking into account the known degree of protonation ({H}$_{DMSO}$ of DMSO-d$_6$, the degrees of protonation and deuteration of CDCl$_3$ are calculated. Table 2 shows the corresponding measured values and calculation results.

TABLE 2

| | Integral IntD from $^2$H NMR spectrum | Integral IntH from $^1$H NMR spectrum | Ratio IntD/IntH | Degree of protonation {H} in % | Degree of deuteration {D} in % |
|---|---|---|---|---|---|
| DMSO | 86.95 | 94.45 | 0.92 | 0.43 | 99.57 |
| Chloroform | 13.05 | 5.55 | 2.35 | 0.17 | 99.83 |

The deuteration degree {D}CDCl$_3$ of chloroform in % can be calculated using the following equation (6):

$$\{D\}_{CDCl3}=100-(\{H\}_{DMSO}\times(\text{Int}H_{DMSO}/\text{Int}D_{DMSO})/(\text{Int}H_{CDCl3}/\text{Int}D_{CDCl3}) \quad (6)$$

Thus, for the deuterated chloroform a degree of deuteration of 99.83% is obtained.

The invention claimed is:

1. A method for determining the degree of deuteration of a first deuterated compound, the method comprises the steps:
   preparing a mixture of the first deuterated compound and a second deuterated compound whose degree of deuteration is known, so that both deuterated compounds are dissolved;
   generating a $^1$H NMR spectrum from the mixture and determining the integrals of at least one peak of each of the two deuterated compounds;
   generating a $^2$H NMR spectrum from the mixture and determining the integrals of the same peaks;
   calculating the degree of deuteration of the first deuterated compound using the determined integral values and the known degree of deuteration of the second deuterated compound by means of equation (4)

$$\{D\}_{Vb1}=100-(\{H\}_{Vb2}\times(\text{Int}H_{Vb2}/\text{Int}D_{Vb2})/(\text{Int}H_{Vb1}/\text{Int}D_{Vb1}) \quad (4)$$

wherein:
   {D}V$_{b1}$=degree of deuteration of the first deuterated compound,
   {H}V$_{b2}$=degree of protonation of the second deuterated compound,
   IntH$_{Vb1}$=Integral of a peak of the first deuterated compound in the $^1$H NMR spectrum,
   IntD$_{Vb1}$=Integral of the same peak of the first deuterated compound in the $^2$H NMR spectrum,
   IntH$_{Vb2}$=Integral of a peak of the second deuterated compound in the $^1$H NMR spectrum, and
   IntD$_{Vb2}$=Integral of the same peak of the second deuterated compound in the $^2$H NMR spectrum.

2. The method of claim 1, wherein at least one of the first and second deuterated compounds is a deuterated solvent for NMR spectroscopy.

* * * * *

UNITED STATES PATENT AND TRADEMARK OFFICE
CERTIFICATE OF CORRECTION

PATENT NO. : 12,292,493 B2
APPLICATION NO. : 16/979137
DATED : May 6, 2025
INVENTOR(S) : Bernd Willi Karl-Heinz Diehl Page 1 of 1

It is certified that error appears in the above-identified patent and that said Letters Patent is hereby corrected as shown below:

In the Claims

Column 18, Line 23: $\{D\}V_{b1}$ should read $\{D\}_{Vb1}$

Column 18, Line 25: $\{H\}V_{b2}$ should read $\{H\}_{Vb2}$

Signed and Sealed this
Twenty-fourth Day of June, 2025

Coke Morgan Stewart
*Acting Director of the United States Patent and Trademark Office*